United States Patent
Lützow et al.

(10) Patent No.: US 9,441,304 B2
(45) Date of Patent: Sep. 13, 2016

(54) AQUEOUS COMPOSITION FOR ETCHING OF COPPER AND COPPER ALLOYS

(71) Applicant: Atotech Deutschland GmbH, Berlin (DE)

(72) Inventors: Norbert Lützow, Berlin (DE); Gabriela Schmidt, Berlin (DE); Dirk Tews, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 14/646,743

(22) PCT Filed: Jul. 29, 2013

(86) PCT No.: PCT/EP2013/065882
§ 371 (c)(1),
(2) Date: May 22, 2015

(87) PCT Pub. No.: WO2014/111173
PCT Pub. Date: Jul. 24, 2014

(65) Prior Publication Data
US 2015/0307999 A1 Oct. 29, 2015

(30) Foreign Application Priority Data
Jan. 15, 2013 (EP) .................................... 13151243

(51) Int. Cl.
*C23F 1/18* (2006.01)
*C23F 1/46* (2006.01)
(Continued)

(52) U.S. Cl.
CPC . *C23F 1/18* (2013.01); *C23F 1/02* (2013.01); *C23F 1/46* (2013.01); *H05K 3/067* (2013.01); *H05K 2203/0789* (2013.01)

(58) Field of Classification Search
None
See application file for complete search history.

(56) References Cited

U.S. PATENT DOCUMENTS

| | | | | |
|---|---|---|---|---|
| 4,281,056 A | * | 7/1981 | Berke | G03C 8/28 423/22 |
| 5,965,612 A | * | 10/1999 | Tse | A01N 45/02 514/255.06 |
| 5,985,527 A | * | 11/1999 | Haijima | G03C 1/0051 430/383 |

(Continued)

FOREIGN PATENT DOCUMENTS

| EP | 0926265 | 6/1999 |
|---|---|---|
| JP | 2011168834 | 9/2011 |
| WO | 2009109391 | 9/2009 |

OTHER PUBLICATIONS

Search Report for corresponding Chinese Application No. 201380066106.5 dated Jan. 12, 2016.

(Continued)

*Primary Examiner* — Allan Olsen
(74) *Attorney, Agent, or Firm* — Renner, Otto, Boisselle & Sklar, LLP

(57) ABSTRACT

The present invention relates to an aqueous composition for and a process for etching copper and copper alloys applying said aqueous composition. The aqueous composition comprises a source for $Fe^{3+}$ ions, at least one acid, at least one triazole or tetrazole derivative, and at least one etching additive selected from N-alkylated iminodipropionic acid, salts thereof, modified polyglycol ethers and quaternary ureylene polymers. The aqueous composition is particularly useful for making of fine structures in the manufacture of printed circuit boards, IC substrates and the like.

19 Claims, 5 Drawing Sheets

(51) Int. Cl.
*H05K 3/06* (2006.01)
*C23F 1/02* (2006.01)

(56) References Cited

U.S. PATENT DOCUMENTS

| | | | | |
|---|---|---|---|---|
| 6,143,443 | A * | 11/2000 | Kazacos | H01M 8/188 429/188 |
| 6,284,309 | B1 | 9/2001 | Bishop et al. | |
| 6,436,395 | B1 * | 8/2002 | Bills | A01N 45/00 424/93.5 |
| 6,436,421 | B1 * | 8/2002 | Schindler | A01N 25/10 424/405 |
| 8,192,636 | B2 | 6/2012 | Tews et al. | |
| 2001/0028977 | A1 * | 10/2001 | Kazacos | B60L 11/1879 429/105 |
| 2003/0145908 | A1 * | 8/2003 | Fukumura | C23C 22/68 148/254 |
| 2006/0131275 | A1 * | 6/2006 | Bian | C09G 1/02 216/88 |
| 2010/0206737 | A1 * | 8/2010 | Preisser | C25D 3/38 205/123 |
| 2010/0252530 | A1 | 10/2010 | Durante et al. | |
| 2010/0323099 | A1 | 12/2010 | Sparing et al. | |
| 2011/0296746 | A1 * | 12/2011 | Hernandez Altamirano | C07C 227/26 44/404 |
| 2012/0024713 | A1 * | 2/2012 | Preisser | C25D 3/38 205/123 |
| 2014/0182471 | A1 * | 7/2014 | Fujii | G03F 7/11 101/453 |

OTHER PUBLICATIONS

PCT/EP2013/065882; PCT International Search Report and Written Opinion of the International Searching Authority dated Aug. 20, 2013.

PCT/EP2013/065882; PCT International Search Report and Written Opinion of the International Searching Authority dated Aug. 20, 2011.

* cited by examiner

AQUEOUS COMPOSITION FOR ETCHING OF COPPER AND COPPER ALLOYS

The present application is a U.S. National Stage Application based on and claiming benefit and priority under 35 U.S.C. §371 of International Application No. PCT/EP2013/065882, filed 29 Jul. 2013, which in turn claims benefit of and priority to European Application No. 13151243.6 filed 15 Jan. 2013, the entirety of both of which is hereby incorporated herein by reference.

FIELD OF THE INVENTION

The invention relates to aqueous compositions for etching of copper and copper alloys and a process for etching of copper and copper alloys in the manufacture of printed circuit boards, IC substrates, copperised semiconductor wafers and the like.

BACKGROUND OF THE INVENTION

Circuit formation by etching of copper or copper alloy layers is a standard manufacturing step in production of printed circuit boards, IC substrates and related devices.

A negative pattern of the circuit is formed by a) applying an etch resist, e.g., a polymeric dry film resist or a metal resist on a layer of copper, b) etching away those portions of copper not covered by the etch resist and c) remove the etch resist from the remaining copper circuit.

Etching solutions applied for this task are selected from different types of compositions such as mixtures of an oxidizing agent and an acid. Two main types of etching solutions are based on an acid such as sulphuric acid or hydrochloric acid and contain as the oxidizing agent either hydrogen peroxide or $Fe^{3+}$ ions added as $FeCl_3$. Such etching solutions are disclosed in C. F. Coombs, Jr., "Printed Circuits Handbook", $5^{th}$ Ed. 2001, Chapter 33.4.3, pages 33.14 to 33.15 and Chapter 33.4.5, pages 33.17.

The ongoing miniaturization of circuits in terms of line width/interline-space values and thickness of the copper layers to be etched does not allow to using conventional etching solutions such as the ones described above.

The disadvantage of known etching solutions is even more present if the copper tracks are manufactured by a semi additive process (SAP). Here the bare dielectric substrate is first coated with a seed layer serving as an electrically conductive layer. The seed layer comprises for example copper deposited by electroless plating. Next, a patterned resist layer is formed on the seed layer and a thicker, second copper layer is deposited by electroplating into the openings of the patterned resist layer onto the seed layer. The patterned resist layer is stripped and the seed layer in between copper tracks deposited by electroplating needs to be removed by a differential etch step. The seed layer deposited by electroless plating has a finer grain structure than the second copper layer deposited by electroplating. The different grain structures can lead to a different etching behaviour of the individual copper layers.

A similar situation is present when copper tracks are manufactured by a modified semiadditive process (m-SAP) wherein a thick, second copper layer is deposited in the openings of the patterned resist layer onto a first thin layer of copper. The first copper layer is manufactured, e.g. by thinning a copper clad attached to the dielectric substrate. Again, both first and second copper layer have a different grain structure.

The etching solution applied for the differential etching step should only remove the first copper layer in between the copper tracks while not attacking the sidewalls and the top of the copper tracks deposited by electroplating and the underlying first copper layer or copper seed layer.

Etching solutions based on sulfuric acid and hydrogen peroxide lead to an undesired undercutting of the first copper layer during etching (FIG. 1) which results in an insufficient adhesion of the copper layer on the dielectric substrate.

Etching solutions based on sulfuric acid and $Fe^{3+}$ ions typically show an etching behaviour as shown in FIG. 2. The broader base of the etched copper line can lead to circuit shorts which are not acceptable.

Objective of the Present Invention

Therefore, it is the first objective of the present invention to provide an aqueous composition for etching of copper and copper alloys which results in the formation of rectangular shaped copper features after etching.

It is a second objective of the present invention to remove $Cu^{2+}$ ions from said aqueous composition.

SUMMARY OF THE INVENTION

The first objective is solved by an aqueous composition for etching of copper and copper alloys, the composition comprising $Fe^{3+}$ ions, at least one acid, at least one triazole or tetrazole derivative, and at least one etching additive selected from the group consisting of N-alkylated iminodipropionic acid and salts thereof, modified polyglycol ethers and quaternary ureylene polymers.

A rectangular line shape of etched copper or copper alloy structures is achieved when applying the aqueous composition of the present invention. Thereby, the risk of circuit shorts between individual copper or copper alloy structures is minimized. Furthermore, a sufficient adhesion between the etched copper or copper alloy structure and the underlying dielectric substrate is achieved.

The second objective of the present invention is solved by a process for etching copper and copper alloys comprising, in this order, the steps of a. providing a substrate having a copper or copper alloy surface,
b. contacting said substrate with the aqueous composition according to the present invention in a first tank wherein during contacting copper is oxidized to $Cu^{2+}$ ions and the $Cu^{2+}$ ions are disclosed in the aqueous composition according to the present invention,
c. transferring a portion of the aqueous composition according to the present invention after contacting with the substrate to a second tank wherein said second tank comprises an anode and a cathode and
d. reducing said $Cu^{2+}$ ions to copper by applying a current between said anode and said cathode.

DETAILED DESCRIPTION OF THE INVENTION

Figure 1:
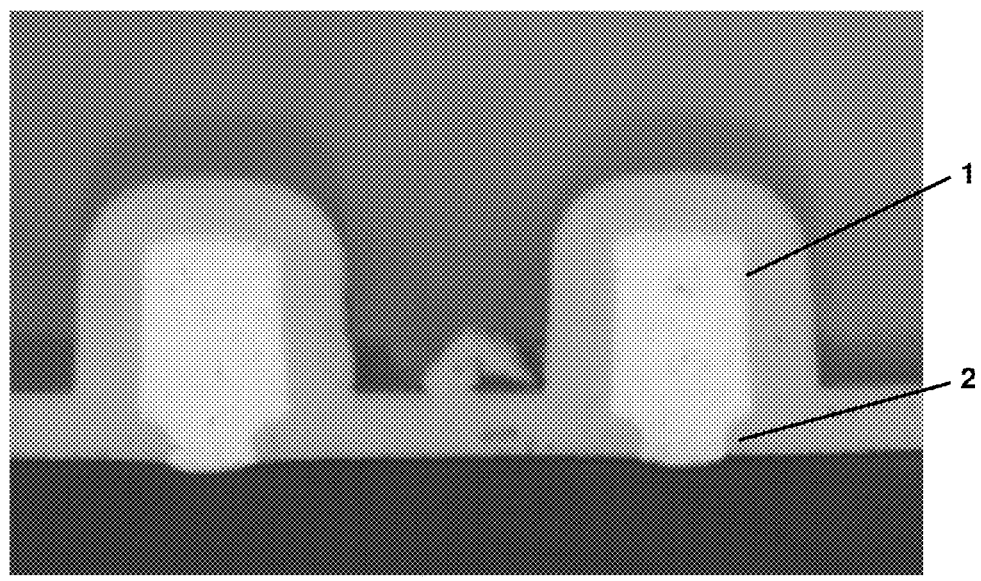
FIG. 1 shows two copper tracks obtained by etching with an aqueous composition consisting of sulfuric acid and hydrogen peroxide (comparative example).

A layer of copper or a copper alloy is etched with an aqueous composition for etching of copper and copper alloys, the composition comprising $Fe^{3+}$ ions, at least one acid, at least one azole derivative, and at least one etching additive selected from the group consisting of N-alkylated iminodipropionic acid, salts thereof, modified polyglycol ethers and quaternary ureylene polymers.

Most preferably, the at least one etching additive is selected from compounds according to formula (I).

The N-alkylated iminodipropionic acid or salt thereof is selected form compounds according to formula (I):

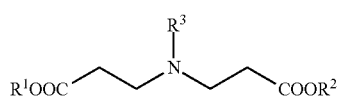

(I)

wherein $R^1$ and $R^2$ are independently selected from the group consisting of H, $Li^+$, $Na^+$, $K^+$, and $NH_4^+$ and $R^3$ is preferably selected from the group consisting of unsubstituted linear $C_1$ to $C_{12}$ alkyl, branched and unbranched, and unsubstituted cyclic $C_5$ to $C_8$ alkyl.

More preferably, $R^3$ is selected from the group consisting of unsubstituted linear $C_3$ to $C_8$ alkyl, branched and unbranched.

Most preferably, $R^3$ is selected from the group consisting of n-pentyl, n-hexyl, n-heptyl, n-octyl, branched pentyl, branched hexyl, branched heptyl and branched octyl.

The term "unsubstituted" is defined herein as containing no residue such as hydroxyl, carboxyl, carbonyl, amino etc.

The term "branched" is defined herein as having one or more side group(s) which is (are) an unsubstituted alkyl residue.

Modified polyglycol ethers are preferably selected from the group consisting of compounds according to formula (II):

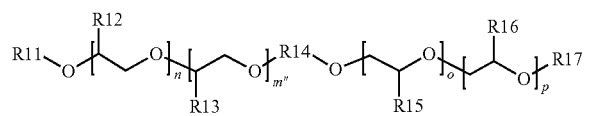

(II)

wherein $R^{11}$ and $R^{17}$ can be equal or different and are selected independently from the group consisting of H or a suitable counter ion like sodium or potassium, $C_1$-$C_{20}$-alkyl, substituted or unsubstituted, linear or branched, $C_1$-$C_6$-alkaryl, linear or branched, allyl, aryl, sulfate, phosphate, halide and sulfonate and wherein each of the multiple $R^{12}$, $R^{13}$, $R^{15}$ and $R^{16}$ groups may be the same or different and are selected independently from the group consisting of H or $C_1$-$C_6$-alkyl, linear or branched, substituted or unsubstituted and wherein $R^{14}$ is selected from the group consisting of $C_1$-$C_{12}$-alkylene, linear or branched, substituted or unsubstituted, aryl 1,2-, 1,3- or 1,4-substituted, naphthyl, 1,3-, 1,4- 1,5- 1,6- or 1,8-substituted, higher annulated aryl, cylcloalkyl and —O—$(CH_2(CH_2)_n OR^{11}$, wherein $R^{11}$ has the meaning defined above and $R^{14}$ is selected from the group represented by formula (III)

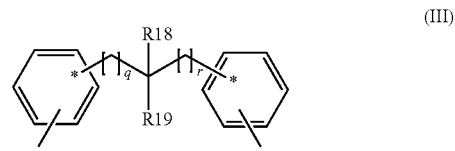

(III)

wherein the substitution independently is 1,2-, 1,3- or 1,4 for each ring and wherein q and r are equal or different and 0 to 10 and $R^{18}$ and $R^{19}$ are selected independently from the group consisting of H or $C_1$-$C_6$-alkyl, linear or branched and wherein m, n, o and p are integral numbers ranging from 0 to 200 and can be equal or different and m+n+o+p is at least 2. Preferably m+n+o+p ranges from 4 to 100, more preferably from 10 to 50.

Substituted alkyl, alkaryl and aryl groups described herein are hydrocarbyl moieties which are substituted with at least one atom other than carbon, including moieties in which a carbon chain atom is substituted with a hetero atom such as nitrogen, oxygen, silicon, phosphorous, boron, sulfur, or a halogen atom. The hydrocarbyl moieties may be substituted with one or more of the following substituents: halogen, heterocyclo, alkoxy, alkenoxy, alkynoxy, aryloxy, hydroxy, protected hydroxy, hydroxycarbonyl, keto, acyl, acyloxy, nitro, amino, amido, nitro, phosphono, cyano, thiol, ketals, acetals, esters and ethers.

Preferred are aqueous solutions, wherein $R^{11}$ and $R^{17}$ of the modified polyglycol ethers according to formula (II) are selected independently from the group consisting of H, methyl, sodium, potassium, halide, sulfate, phosphate and sulfonate.

Preferred are aqueous solutions, wherein $R^{12}$, $R^{13}$, $R^{15}$ and $R^{16}$ of modified polyglycol ethers according to formula (II) are selected independently from the group consisting of H, methyl, ethyl, n-propyl and isopropyl.

Preferred are aqueous solutions wherein $R^{14}$ of the modified polyglycol ethers according to formula (II) is selected from the group represented by formulae (IV) and (V)

(IV)

and

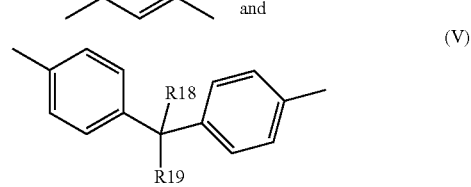

(V)

and wherein $R^{18}$ and $R^{19}$ are selected from the group consisting of H, methyl, ethyl, n-propyl and isopropyl.

Modified polyglycol ethers according to formula (II) having the following formulae are particularly preferred.

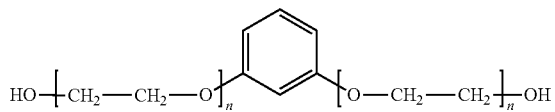
(VI)

and wherein n=1-20, preferably 3-8.

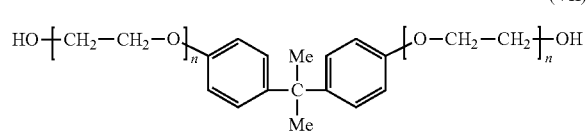
(VII)

and wherein n=1-20, preferably 2-10.

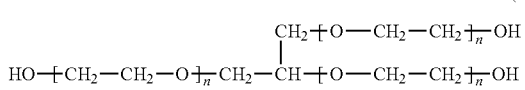
(VIII)

and wherein n=1-20, preferably 2-7.

The quaternary ureylene polymer is preferably selected from polymers having the formulae (IX) and (X):

(IX)

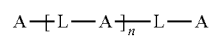
(X)

wherein n is an integer and preferably ranges from 1 to 40, more preferably from 3 to 30 and most preferably from 5 to 20. Monomer A is derived from a diamino compound represented by compounds according to formulae (XI) to (XIII):

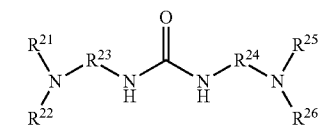
(XI)

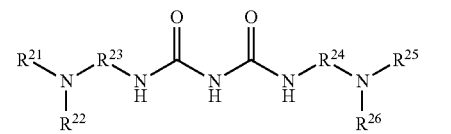
(XII)

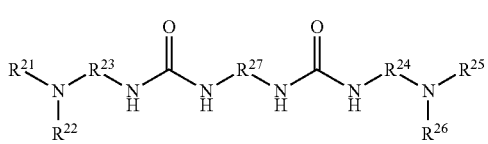
(XIII)

wherein $R^{21}$, $R^{22}$, $R^{25}$, and $R^{26}$ are independently selected from the group consisting of a substituted or unsubstituted hydrocarbon residue with 1 to 10 carbon atoms, preferably methyl, ethyl, hydroxyethyl or —$CH_2CH_2(OCH_2CH_2)_y$—OH, wherein y is between 0 and 4, and $R^{23}$, $R^{24}$ and $R^{27}$ are independently selected from the group consisting of $(CH_2)_p$, wherein p stands for an integer of 2 to 12, preferably for an ethylene or propylene group, or for a —$[CH_2CH_2O]_m$—$CH_2CH_2$— group, wherein m is between 1 and 40, preferably for a —$(CH_2)_2$—O—$(CH_2)_2$— or —$(CH_2)_2$—O—$(CH_2)_2$—O—$(CH_2)_2$— group.

Preferably, monomer A is selected from compounds according to formula (XI).

Monomer L in the at least one ureylene polymer according to formulae (IX) and (X) stands for a divalent residue, which is selected from the group consisting of —$(CH_2)_p$—, wherein p is an integer preferably between 1 and 12, more preferably between 1 and 6, and most preferably between 2 and 4, —$CH_2$—CH(OH)—$CH_2$—, —$[CH_2O]_q$—$CH_2CH_2$— and —$[CH_2CH_2O]_q$—$CH_2CH_2$—, wherein q is an integer between 1 and 40, preferably —$(CH_2)$—O—$(CH_2)_2$—, —$(CH_2)_2$—O—$(CH_2)_2$— or —$(CH_2)_2$—O—$(CH_2)_2$—O—$(CH_2)_2$—, and —$CH_2$—CH(OH)—$CH_2$—.

The concentration of the at least one etching additive in the aqueous composition preferably ranges from 0.1 to 1.0 g/l, more preferably from 0.25 to 0.75 g/l.

The aqueous composition further comprises at least one triazole or tetrazole derivative preferably selected from the group comprising 5-amino-1H-tetrazole, 5-phenyl-1H-tetrazole, 1-phenyl-1H-tetrazol-5-thiol, 1-[2-(Diemthylamino)-ethyl]-1H-terazole-5-thiol, 1-H-benzotriazole, 1H-tolyltriazole and 5-carboxy-1H-benzotriazole.

Most preferably, the at least one triazole or tetrazole derivative is benzotriazole.

The concentration of the at least one triazole derivative ranges from 1 to 100 mg/l, more preferably from 5 to 50 mg/l and most preferably from 10 to 25 mg/l.

The at least one triazole derivative present in the aqueous composition according to the present invention serves as a complexing agent for copper ions which are formed during etching.

The source for $Fe^{3+}$ ions is preferably selected from water soluble salts of $Fe^{3+}$ ions. The most preferred source of $Fe^{3+}$ ions is $Fe_2(SO_4)_3$.

The concentration of $Fe^{3+}$ ions preferably ranges from 1 to 100 g/l, more preferably from 1 to 50 g/l and most preferably from 5 to 40 g/l.

The at least one acid is selected from the group comprising mineral acids such as sulfuric acid, and organic acids such as methanesulfonic acid. The most preferred acids are sulfuric acid and methanesulfonic acid.

The concentration of the acid (or all acids together in case more than one acid is added) ranges from 10 to 400 g/l, more preferably from 30 to 300 g/l and most preferably from 50 to 200 g/l.

The aqueous composition according to the present invention may further comprises chloride ions, preferably in a concentration in the range of 5 to 500 mg/l, more preferably in the range of 10 to 200 mg/l and most preferably in the range of 20 to 100 mg/l. The source of chloride ions is preferably a compound selected from the group comprising LiCl, NaCl, KCl, and $NH_4Cl$.

In order to provide chloride ions in the desired concentration range and at the same time preferably providing a pH of the aqueous composition of <4, more preferably <2. Hydrochloric acid is not preferred as a source of chloride ions.

Optionally, the aqueous composition further contains one or more of $Fe^{2+}$ ions, surfactants, organic sulfur compounds such as thiourea and sulfosalicylic acid and polyalkylene compounds such as polyethylene glycol, polypropylene glycol, copolymers of polyethylene glycol and polypropylene glycol and derivates thereof of which all may improve the etching behaviour of the aqueous composition according to the present invention.

The substrates are preferably treated by spraying the aqueous composition according to the invention onto the substrates. The aqueous composition can be sprayed in a vertical mode or horizontal mode, depending on the equipment desired. Alternatively, the substrates can be immersed into the aqueous composition by dipping.

The temperature of the aqueous composition according to the present invention during use preferably ranges from 10 to 60° C., more preferably from 20 to 50° C. and most preferably from 30 to 45° C. The contact time depends on the copper thickness to be etched and is in the range from 10 to 360 s, more preferably from 20 to 200 s and most preferably from 30 to 90 s.

During use the aqueous composition is enriched in $Cu^{2+}$ ions (they are disposed in the aqueous composition according to the present invention). At the same time $Fe^{3+}$ ions are reduced to $Fe^{2+}$ ions. $Cu^{2+}$ ions have a negative impact on the performance of the aqueous composition. $Cu^{2+}$ ions increase the density and viscosity of the etching solution and thereby negatively effect the etching behaviour. The etch rate and side wall etching performance may decrease. Furthermore, precipitation of $Cu^{2+}$ ion complexes can occur. Such precipitates pose a mechanical danger to the equipment and the surfaces coming into contact with the aqueous etching composition.

In processes according to prior art some or all of the added $Cu^{2+}$ ions are removed by bleeding (removing) an adequate amount of etching solution and adding (feeding) fresh etching solution to the remaining solution.

One particular method to remove $Cu^{2+}$ ions from an aqueous solution is to electrolytically reduce $Cu^{2+}$ ions to metallic copper.

In principle, a second tank equipped with an anode and a cathode and a rectifier is required for electrolysis.

Portions of the aqueous composition according to the present invention are transferred from a first tank where or from which the etching of copper or a copper alloy layer is performed to a second tank equipped for electrolysis. During electrolysis $Cu^{2+}$ ions are cathodically reduced to metallic copper and at the same time $Fe^{2+}$ ions are oxidised anodically to $Fe^{3+}$ ions.

The metallic copper can be collected and recycled. Without an electrolytic regeneration cell the oxidizing agent ($Fe^{3+}$ ions) would need to be continuously added to the etching solution. By application of the above described regeneration the spent $Fe^{3+}$ ions are regenerated at the anodes ($Fe^{2+}$ is oxidised to $Fe^{3+}$) and thereby no adding (feeding) of the oxidising agent during use of the etching solution is required.

A method and an apparatus useful for this process are disclosed in US 2006/0175204 A1. This method involves feeding of the etching solution into an electrolysis cell being hermetically sealed or having an anode hood, the electrolysis cell comprising a cathode, an inert anode, means for removing the electrolytically deposited copper from the cathode and means for collecting the removed copper and applying a potential to the removed copper, wherein the electrolysis cell does not have an ion exchange membrane or a diaphragm.

EXAMPLES

The invention will now be illustrated by reference to the following non-limiting examples.

A substrate containing a dielectric layer, a seed layer obtained by electroless plating of copper and a patterned second layer of copper obtained by electroplating was used throughout all examples.

The seed layer not covered by the patterned second layer of copper was etched away by spraying different aqueous compositions onto the substrates with an adjusted copper etch rate of 2 µm/min. The contact time was adjusted to provide the required copper removal. The samples were rinsed with water and the dry film resist was stripped.

The obtained line shapes of the etched copper tracks were investigated from cross-sections by optical microscope after depositing a nickel layer onto the copper tracks which serves as a protection layer during preparation of the cross-sections.

Example 1

Comparative

An aqueous composition consisting of 20 g/l $H_2O_2$ and 90 g/l sulfuric acid was applied as etching solution.

The resulting line shape of copper tracks (track width: 8 µm, track height: 10 µm) is shown in FIG. 1. The copper tracks 1 show a severe undercutting 2 of the track base (i.e. the seed layer obtained by electroless plating of copper). Hence, the copper track has not the required rectangular shape and no sufficient adhesion to the underlying dielectric substrate.

Example 2

Comparative

An aqueous composition consisting of 5 g/l $Fe_2(SO_4)_3$ and 90 g/l sulfuric acid was applied as etching solution.

Figure 2:
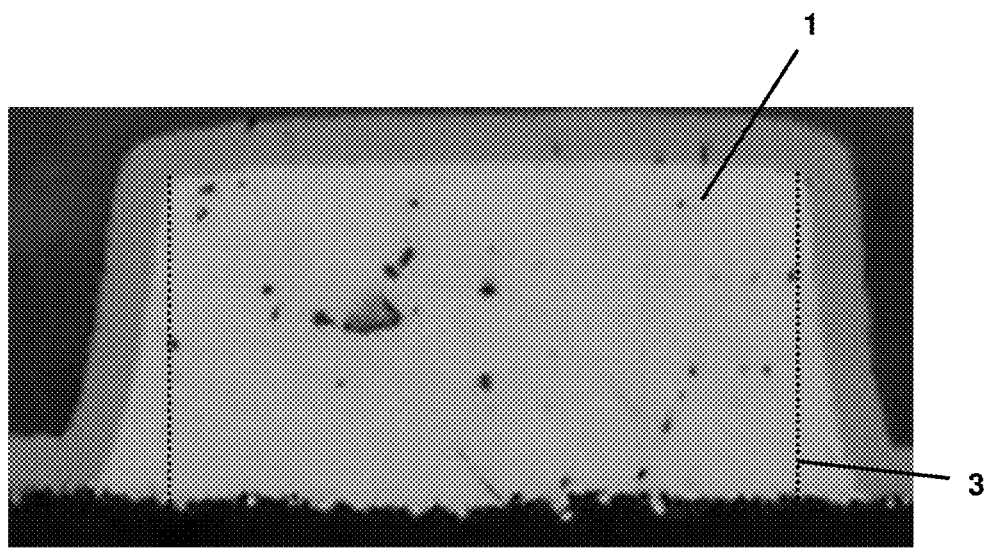
FIG. 2 shows a copper track obtained by etching with an aqueous composition consisting of sulfuric acid and $Fe^{3+}$ ions (comparative example).

The resulting line shape of the copper tracks (track width: 20 µm, track height: 10 µm) is shown in FIG. 2. The copper track 1 shows a strong trapezoidal shape indicated by the dotted lines 3. Hence, the copper track does not provide the desired rectangular shape and poses the danger of circuit shorts or cross-talk between individual tracks.

Example 3

An aqueous composition consisting of 15 g/l $Fe_2(SO_4)_3$, 90 g/l sulfuric acid, 15 mg/l benzotriazole, and 0.7 g/l of an etching additive according to formula (I) wherein $R^1$ is H, $R^2$ is $Na^+$ and $R^3$ is 2-ethyl-hexyl was applied as etching solution.

Figure 3:
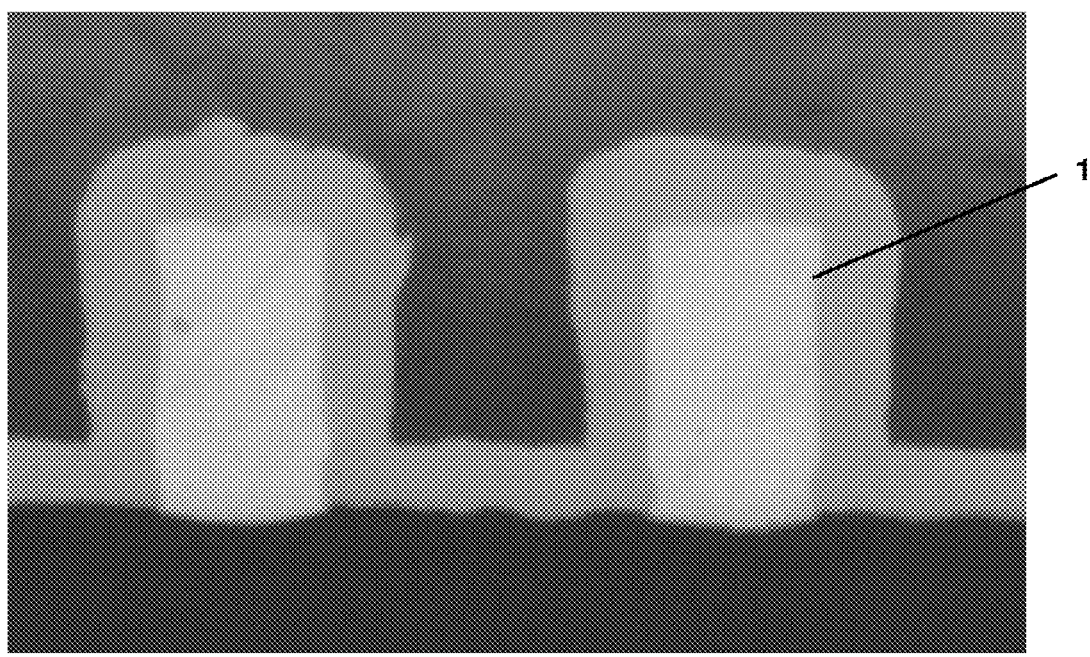
FIG. 3 shows two copper tracks obtained by etching with an aqueous composition comprising a N-alkylated iminodipropionic acid.

The resulting line shape of the copper tracks (track width: 8 µm, track height: 10 µm) is shown in FIG. 3. The copper tracks 1 have the desired rectangular line shape, have a sufficient adhesion to the underlying dielectric substrate and pose no risk for circuit shorts or cross-talk between individual tracks.

Example 4

An aqueous composition consisting of 15 g/l $Fe_2(SO_4)_3$, 90 g/l sulfuric acid, 15 mg/l benzotriazole, and 200 mg/l of an etching additive according to formula (VII) (CAS No.: 29086-67-7) was applied as etching solution.

Figure 4:
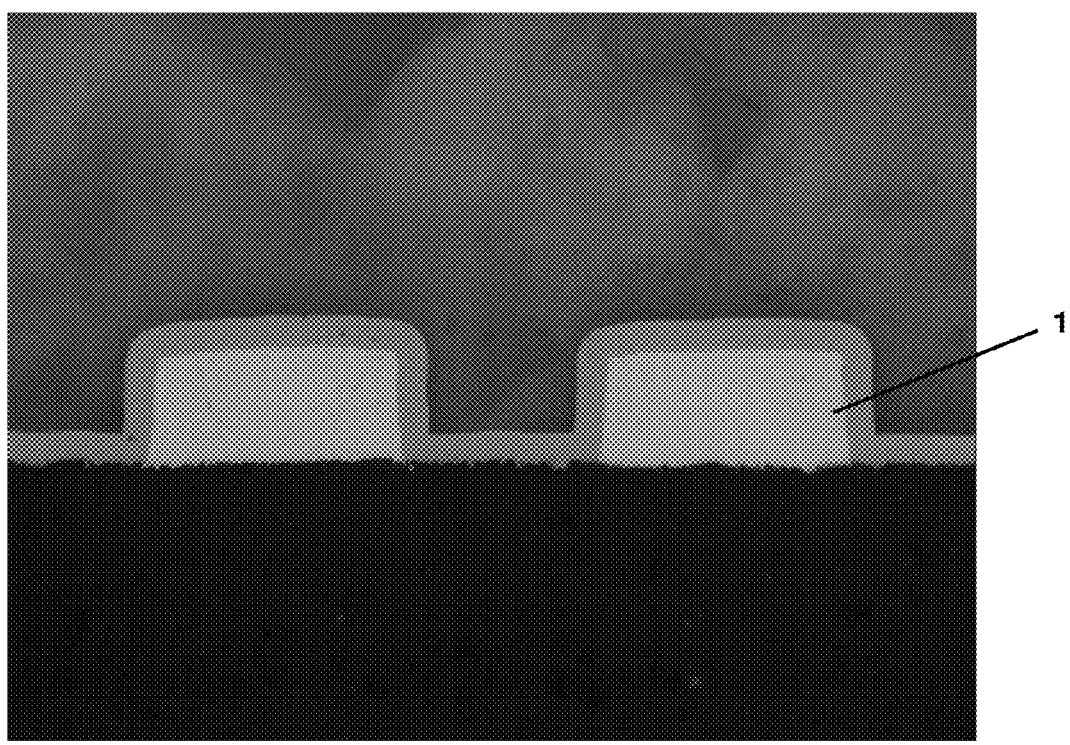
FIG. 4 shows two copper tracks obtained by etching with an aqueous composition comprising a modified polyglycol ether.

The resulting line shape of the copper tracks (track width: 20 µm, track height: 10 µm) is shown in FIG. 4. The copper tracks 1 have the desired rectangular line shape, have a sufficient adhesion to the underlying dielectric substrate and pose no risk for circuit shorts or cross-talk between individual tracks.

Example 5

An aqueous composition consisting of 15 g/l $Fe_2(SO_4)_3$, 90 g/l sulfuric acid, 16 mg/l benzotriazole, and 20 mg/l of an etching additive according to formula (IX) wherein A is selected from a monomer according to formula (XI) wherein $R^{21}$, $R^{22}$, $R^{25}$ and $R^{26}$ are methyl and $R^{22}$ and $R^{24}$ are $(CH_2)_3$—, and L is a —$(CH_2)_2$—O—$(CH_2)_2$— residue was applied as etching solution.

Figure 5:
FIG. 5 shows two copper tracks obtained by etching with an aqueous composition comprising a quaternary ammonium polymer.

The resulting line shape of the copper tracks (track width: 20 track height: 10 µm) is shown in FIG. 5. The copper tracks 1 have the desired rectangular line shape, have a sufficient adhesion to the underlying dielectric substrate and pose no risk for circuit shorts or cross-talk between individual tracks.

The invention claimed is:

1. An aqueous composition for etching of copper and copper alloys comprising a source for $Fe^{3+}$ ions, at least one acid, at least one triazole or tetrazole derivative, and at least one etching additive selected from the group consisting of N-alkylated iminodipropionic acid, salts thereof, modified polyglycol ethers and quaternary ureylene polymers,
wherein the quaternary ureylene polymer is selected from polymers according to formulae (IX) and (X)

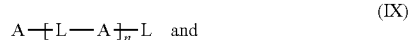 (IX)

 (X)

wherein n is an integer ranging from 1 to 40, and wherein monomer A is derived from a diamino compound represented by compounds according to formulae (XI) to (XIII):

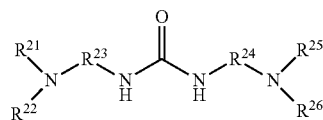 (XI)

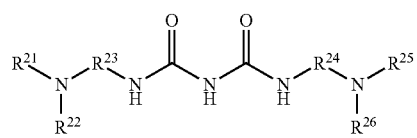 (XII)

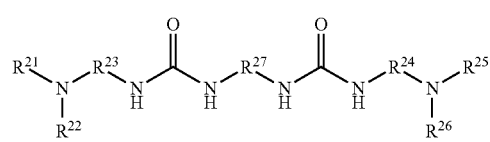 (XIII)

wherein $R^{21}$, $R^{22}$, $R^{25}$, and $R^{26}$ are independently selected from the group consisting of a substituted or unsubstituted hydrocarbon residue with 1 to 10 carbon atoms and
$R^{23}$, $R^{24}$ and $R^{27}$ are independently selected from $(CH_2)_p$, wherein p stands for an integer of 2 to 12, or for a —$[CH_2CH_2O]_m$—$CH_2CH_2$— group, wherein m is between 1 and 40, wherein monomer L is selected from the group consisting of
—$(CH_2)_p$—, wherein p is an integer between 1 and 12, —$CH_2$—CH(OH)—$CH_2$—, —$[CH_2O]_q$—$CH_2CH_2$— and —$[CH_2CH_2O]_q$—$CH_2CH_2$—, wherein q is an integer between 1 and 40, and wherein the at least one etching additive is a quaternary ureylene polymer according to formula (IX) wherein A is selected from a monomer according to formula (XI) wherein $R^{21}$, $R^{22}$, $R^{25}$ and $R^{26}$ are methyl and $R^{23}$ and $R^{24}$ are —$(CH_2)_3$—, and L is a —$(CH_2)_2$—O—$(CH_2)_2$— residue.

2. The aqueous composition for etching of copper and copper alloys according to claim 1 wherein the N-alkylated iminodipropionic acid or salts thereof is selected from compounds according to formula (I)

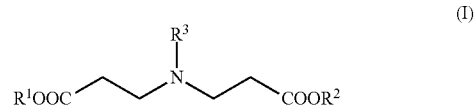 (I)

wherein $R^1$ and $R^2$ are independently selected from the group consisting of H, $Li^+$, $Na^+$, $K^+$ and $NH_4^+$, and $R^3$ is selected from the group consisting of unsubstituted $C_1$ to $C_{12}$ alkyl, branched and unbranched, and unsubstituted cyclic $C_5$ to $C_8$ alkyl.

3. The aqueous composition for etching of copper and copper alloys according to claim 2 wherein $R^3$ in formula (I) is selected from $C_3$- to $C_8$-alkyl, branched and unbranched.

4. The aqueous composition for etching of copper and copper alloys according to claim 3 wherein $R^3$ in formula (I) is selected from the group consisting of propyl, butyl, pentyl, hexyl, branched propyl, branched butyl, branched pentyl and branched hexyl.

5. The aqueous composition for etching of copper and copper alloys according to claim 2 wherein $R^3$ in formula (I) is selected from the group consisting of propyl, butyl, pentyl, hexyl, branched propyl, branched butyl, branched pentyl and branched hexyl.

6. The aqueous composition for etching of copper and copper alloys according to claim 2 wherein the at least one triazole or tetrazole derivative is selected from 5-amino-1H-tetrazole, 5-phenyl-1H-tetrazole, 1-phenyl-1H-tetrazol-5-thiol, 1-[2-(dimethylamino)-ethyl]-1H-tetrazole-5-thiol, 1-H-benzotriazole, 1H-tolyltriazole and 5-carboxy-1H-benzotriazole.

7. The aqueous composition for etching of copper and copper alloys according to claim 2 wherein $R^1$ is H, $R^2$ is Na+ and $R^3$ is 2-ethyl-hexyl.

8. The aqueous composition for etching copper and copper alloys according to claim 1 wherein the modified polyglycol ether is selected from the group consisting of compounds according to formula (II):

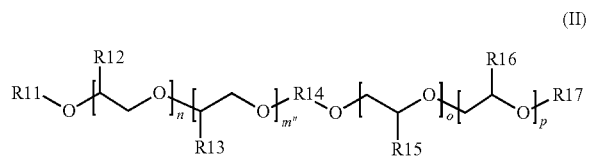

(II)

wherein $R^{11}$ and $R^{17}$ can be equal or different and are selected independently from the group consisting of H or a suitable counter ion, $C_1$-$C_{20}$-alkyl, substituted or unsubstituted, linear or branched, $C_1$-$C_6$-alkaryl, linear or branched, allyl, aryl, sulfate, phosphate, halide and sulfonate and wherein each of the multiple $R^{12}$, $R^{13}$, $R^{15}$ and $R^{16}$ groups may be the same or different and are selected independently from the group consisting of H or $C_1$-$C_6$-alkyl, linear or branched, substituted or unsubstituted and wherein $R^{14}$ is selected from the group consisting of $C_1$-$C_{12}$-alkylene, linear or branched, substituted or unsubstituted, aryl 1,2-, 1,3- or 1,4-substituted, naphthyl, 1,3-, 1,4- 1,5- 1,6- or 1,8-substituted, higher annulated aryl, cylcloalkyl and —O—(CH$_2$(CH$_2$)$_n$OR$^{11}$, wherein $R^{11}$ has the meaning defined above or $R^{14}$ is selected from the group represented by formula (III)

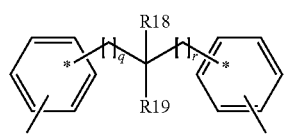

(III)

wherein the substitution independently is 1,2-, 1,3- or 1,4- for each ring and wherein q and r are equal or different and 0 to 10 and $R^{18}$ and $R^{19}$ are selected independently from the group consisting of H or $C_1$-$C_6$-alkyl, linear or branched and wherein m, n, o and p are integral numbers ranging from 0 to 200 and can be equal or different and m+n+o+p is at least 2.

9. The aqueous composition for etching of copper and copper alloys according to claim 8 wherein the at least one triazole or tetrazole derivative is selected from 5-amino-1H-tetrazole, 5-phenyl-1H-tetrazole, 1-phenyl-1H-tetrazol-5-thiol, 1-[2-(dimethylamino)-ethyl]-1H-terazole-5-thiol, 1-H-benzotriazole, 1H-tolyltriazole and 5-carboxy-1H-benzotriazole.

10. The aqueous composition for etching of copper and copper alloys according to claim 1 wherein the concentration of the at least one etching additive ranges from 0.1 to 1.0 g/l.

11. The aqueous composition for etching of copper and copper alloys according to claim 1 wherein the at least one triazole or tetrazole derivative is selected from 5-amino-1H-tetrazole, 5-phenyl-1H-tetrazole, 1-phenyl-1H-tetrazol-5-thiol, 1-[2-(dimethylamino)-ethyl]-1H-tetrazole-5-thiol, 1-H-benzotriazole, 1H-tolyltriazole and 5-carboxy-1H-benzotriazole.

12. The aqueous composition for etching of copper and copper alloys according to claim 1 wherein the concentration of the at least one triazole or tetrazole derivative ranges from 1 to 100 mg/l.

13. The aqueous composition for etching of copper and copper alloys according to claim 1 wherein the source for $Fe^{3+}$ ions is $Fe_2(SO_4)_3$.

14. The aqueous composition for etching of copper and copper alloys according to claim 1 wherein the concentration of $Fe^{3+}$ ions ranges from 1 to 100 g/l.

15. The aqueous composition for etching of copper and copper alloys according to claim 1 wherein the at least one acid is selected from sulfuric acid and methanesulfonic acid.

16. The aqueous composition for etching of copper and copper alloys according to claim 1 wherein the concentration of the at least one acid ranges from 10 to 400 g/l.

17. A process for etching copper or copper alloys comprising, in this order, the steps of
   a. providing a substrate having a copper or copper alloy surface,
   b. contacting said substrate with the aqueous composition according to claim 1 in a first tank,
      wherein during contacting copper is oxidized to $Cu^{2+}$ ions and the $Cu^{2+}$ ions are dissolved in said aqueous composition,
   c. transferring a portion of said aqueous composition after contacting with the substrate to a second tank wherein said second tank comprises an anode and a cathode and
   d. reducing said $Cu^{2+}$ ions to copper by applying a current between said anode and said cathode.

18. An aqueous composition for etching of copper and copper alloys comprising a source for $Fe^{3+}$ ions, at least one acid, at least one triazole or tetrazole derivative, and at least one etching additive selected from the group consisting of N-alkylated iminodipropionic acid, salts thereof, modified polyglycol ethers and quaternary ureylene polymers, wherein the at least one etching additive is a modified polyglycol ether having general formula (VII):

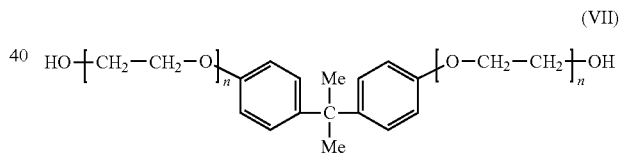

(VII)

wherein n=1-20.

19. A process for etching copper or copper alloys comprising, in this order, the steps of
   a. providing a substrate having a copper or copper alloy surface,
   b. contacting said substrate with the aqueous composition according to claim 18 in a first tank,
      wherein during contacting copper is oxidized to $Cu^{2+}$ ions and the $Cu^{2+}$ ions are dissolved in said aqueous composition,
   c. transferring a portion of said aqueous composition after contacting with the substrate to a second tank wherein said second tank comprises an anode and a cathode and
   d. reducing said $Cu^{2+}$ ions to copper by applying a current between said anode and said cathode.

* * * * *